United States Patent [19]

Hii et al.

[11] Patent Number: 5,936,900
[45] Date of Patent: Aug. 10, 1999

[54] INTEGRATED CIRCUIT MEMORY DEVICE HAVING BUILT-IN SELF TEST CIRCUIT WITH MONITOR AND TESTER MODES

[75] Inventors: Kuong Hua Hii, Singapore, Singapore; Theo J. Powell, Dallas; Daniel R. Cline, Murphy, both of Tex.

[73] Assignee: Texas Instruments Incorporated, Dallas, Tex.

[21] Appl. No.: 08/970,308

[22] Filed: Nov. 14, 1997

Related U.S. Application Data

[60] Provisional application No. 60/033,508, Dec. 19, 1996.

[51] Int. Cl.⁶ .................................................. G11C 7/00
[52] U.S. Cl. .................... 365/201; 365/230.08; 365/191; 365/189.05
[58] Field of Search .............................. 365/201, 230.05, 365/49, 230.08, 230.02, 191, 189.05

[56] References Cited

U.S. PATENT DOCUMENTS

| | | | |
|---|---|---|---|
| 5,327,363 | 7/1994 | Akiyama | 364/580 |
| 5,535,164 | 7/1996 | Adams et al. | 365/201 |
| 5,548,553 | 8/1996 | Cooper et al. | 365/200 |
| 5,568,437 | 10/1996 | Jamal | 365/201 |
| 5,588,006 | 12/1996 | Nozuyama | 371/3 |
| 5,617,531 | 4/1997 | Crouch et al. | 395/183 |
| 5,640,354 | 6/1997 | Jang et al. | 365/201 |
| 5,640,404 | 6/1997 | Satish | 371/22.3 |
| 5,640,509 | 6/1997 | Balmer et al. | 395/183.18 |
| 5,661,729 | 8/1997 | Miyazaki et al. | 371/21.2 |
| 5,661,732 | 8/1997 | Lo et al. | 371/22.2 |
| 5,689,466 | 11/1997 | Qureshi | 365/201 |

OTHER PUBLICATIONS

Hiroli Koike, Toshio Takeshima, Masahide Takada; Bist Circuit Macro Using Microprogram ROM for LSI Memories, IEICE Transactions of Electronics, vol. E78C, No. 7, Jul. 1995. Tokyo. pp. 838–844.

Manoj Franklin, Kewai K. Saluja, Built–in Self–Testing of Random–Access Memories, 8153 Computer, 23 (1990) Oct., No. 10, Los Alamitos, CA, pp. 45–56.

Hiroli Koike, Toshio Takeshima, Masahide Takada; A Bist Scheme Using Microprogram ROM For Large Capacity Memories, 1990 International Test Conference, Paper 36.1, pp. 815–822.

Primary Examiner—David Nelms
Assistant Examiner—Thong Le
Attorney, Agent, or Firm—Robby T. Holland; Carlton H. Hoel; Richard L. Donaldson

[57] ABSTRACT

An integrated circuit memory device (10) is provided that has a self test monitor mode. The memory device (10) includes a memory array (26) having a plurality of memory cells. The memory device (10) further includes a built-in self test circuit (12) connected to receive a self test select signal. The built-in self test circuit (12) is operable, when the memory device (10) is in self test mode, to generate internal self test signals for operating and testing the memory array (26). A data buffer (28) is connected to receive the internal self test signals and a monitor mode signal. The data buffer (28) is operable, when the memory device (10) is in self test monitor mode, to connect the internal self test signals to terminals of the memory device (10) to provide the internal self test signals externally from the memory device (10). The monitored internal self test signals can be used to verify operation of the built-in self test circuit (12). The monitored self test signals can also be used in a tester mode to test other memory devices.

15 Claims, 3 Drawing Sheets

INTEGRATED CIRCUIT MEMORY DEVICE HAVING BUILT-IN SELF TEST CIRCUIT WITH MONITOR AND TESTER MODES

This is a Non Provisional application filed under 35 USC 119(e) and claims priority of prior provisional Ser. No. 60/033,508 of inventor Hii et al filed on Dec. 19, 1996.

This application is related to Ser. No. 08/846,922 of inventor Hii et al. filed on Apr. 30, 1997 which claims priority under 35 USC 119(e) of prior provisional Ser. No. 60/016,516 of inventor Hii et al. filed on Apr. 30, 1996.

This application is also related to Ser. No. 08/840,362 of inventor Hii et al. filed on Apr. 29, 1997 which claims priority under 35 USC 119(e) of prior provisional Ser. No. 60/016,875 of inventor Hii et al. filed on Apr. 29, 1996

TECHNICAL FIELD OF THE INVENTION

This invention relates in general to the field of integrated circuit memory devices, and more particularly to an integrated circuit memory device having a built-in self test (BIST) circuit with monitor and tester modes.

BACKGROUND OF THE INVENTION

Built-in self test (BIST) schemes can be used to test the operation of integrated circuit devices including memory devices. For memory devices, conventional approaches used to verify the BIST circuitry, itself, involve executing the BIST for a fraction of the memory array, and then migrating to a tester to check the data values in the memory array. Proper operation of the BIST can then be verified. In addition, any change to the data in the memory array caused by BIST operation can be verified by interrupting the BIST at the appropriate time. This BIST verification approach has been used by conventional integrated circuits such as that described in "A BIST Scheme Using Microprogram ROM for Large Capacity Memories," 1990 International Test Conference, pages 815–822. Other approaches for verifying BIST circuitry include using a scan or compressing the data for internal testing to a signature, which can be compared later to respectively expected scan data or expected signatures.

SUMMARY OF THE INVENTION

In accordance with the present invention, an integrated circuit memory device having a built-in self test (BIST) circuit with monitor and tester modes is provided that substantially reduces or eliminates problems and disadvantages of prior BIST schemes for integrated circuit memory devices.

According to one aspect of the present invention, an integrated circuit memory device is provided that has a self test monitor mode. The memory device includes a memory array having a plurality of memory cells. The memory device further includes a built-in self test circuit connected to receive a self test select signal. The built-in self test circuit is operable, when the memory device is in self test mode, to generate internal self test signals for operating and testing the memory array. A data buffer is connected to receive the internal self test signals and a monitor mode signal. The data buffer is operable, when the memory device is in self test monitor mode, to connect the internal self test signals to terminals of the memory device to provide the internal self test signals externally from the memory device.

According to another aspect of the present invention, a method of operation is provided for an integrated circuit memory device to allow monitoring of a built-in self test circuit. A monitor mode signal is received by the memory device indicating that the memory device is in a self test monitor mode. Internal self test signals generated by the built-in self test circuit are then connected to terminals of the memory device responsive to the indication of self test monitor mode. The terminals are available for external connection to monitor the internal self test signals.

According to a further aspect of the present invention, a method is provided for testing an integrated circuit memory device using another integrated circuit memory device having a built-in self test circuit. Internal self test signals generated by a built-in self test circuit in a first memory device are connected to terminals of the first memory device. The terminals of the first memory device are connected to terminals of a second memory device such that the second memory device receives the self test signals from the first memory device. A self test process of the built-in self test circuit is run to test the second memory device using the self test signals. Pass/fail signals are then provided that indicate results of testing the second memory device.

A technical advantage of the present invention is the ability to monitor selected signals within the BIST circuitry by making those signals available on external output terminals by multiplexing the output terminals of the integrated circuit memory device.

The present invention provides another technical advantage of allowing the use of the monitored signals in a tester mode to test other integrated circuit memory devices.

BRIEF DESCRIPTION OF THE DRAWINGS

A more complete understanding of the present invention and advantages thereof may be acquired by referring to the following description taken in conjunction with the accompanying drawings in which like reference numbers indicate like features, and wherein.

DETAILED DESCRIPTION OF THE INVENTION

Testing integrated circuit memory devices, such as DRAMs and SDRAMs, from a conventional tester generally requires multiple test signals such as clock, RAS, CAS, WE, data, CS and address signals. According to the teachings of the present invention, such signals are generated by a built-in self test (BIST) circuit and can be monitored at the output terminals of the integrated circuit memory device. This allows both the monitoring of the BIST circuit operation as well as the use of the BIST circuit in a tester mode for testing other integrated circuit memory devices. The tester mode is possible because the monitored signals can be the same signals otherwise used to test integrated circuit memory device. According to the present invention, it is also possible to include a memory chip with BIST circuitry in a system and to test the system memory by issuing commands to the memory chip with BIST circuitry to test other system memory chips.

Figure 1A:
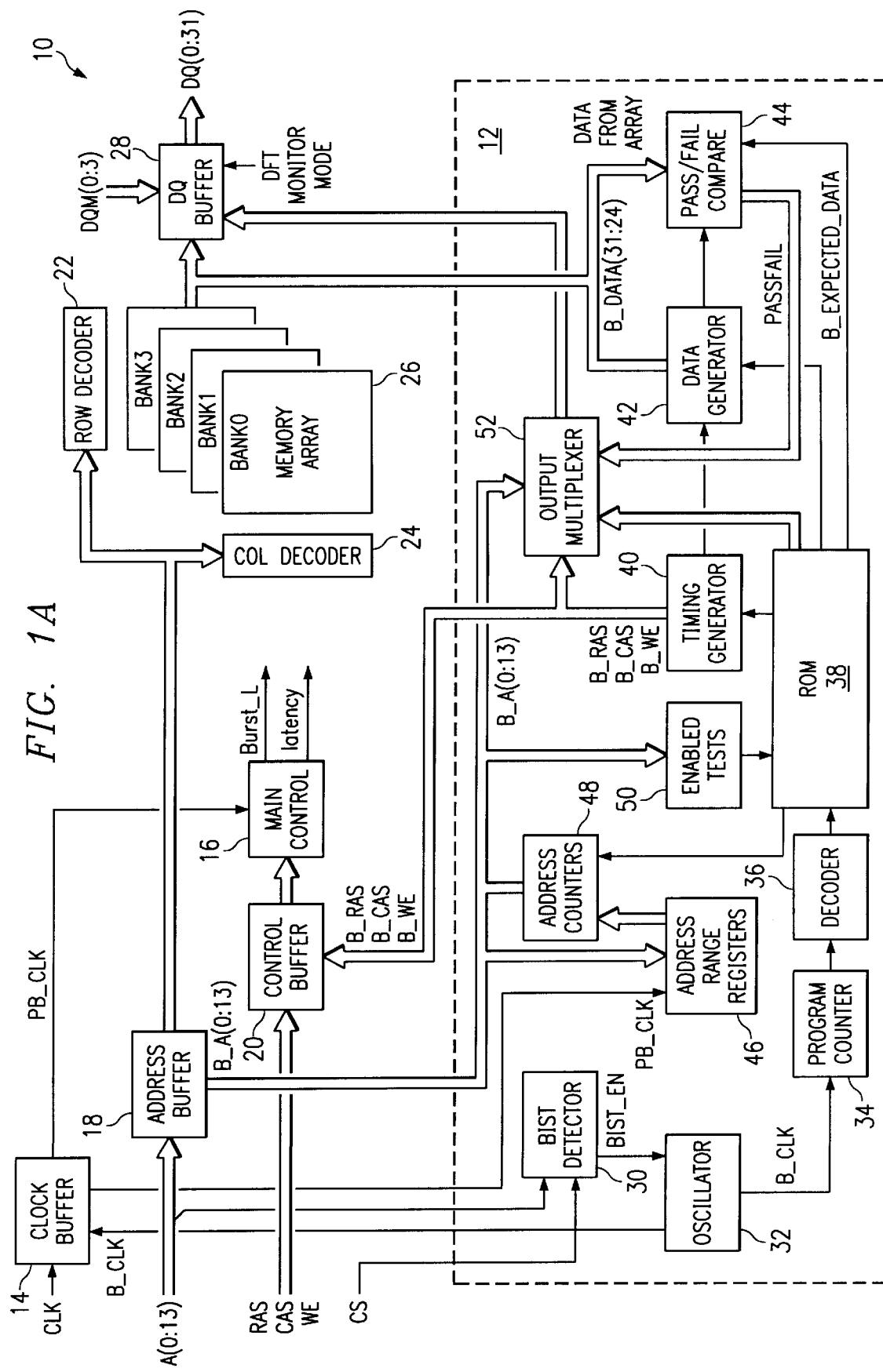
FIGS. 1A and 1B are block diagrams of one embodiment of an integrated circuit memory device having a built-in self test circuit with a monitor mode according to the teachings of the present invention.
Figure 1B:
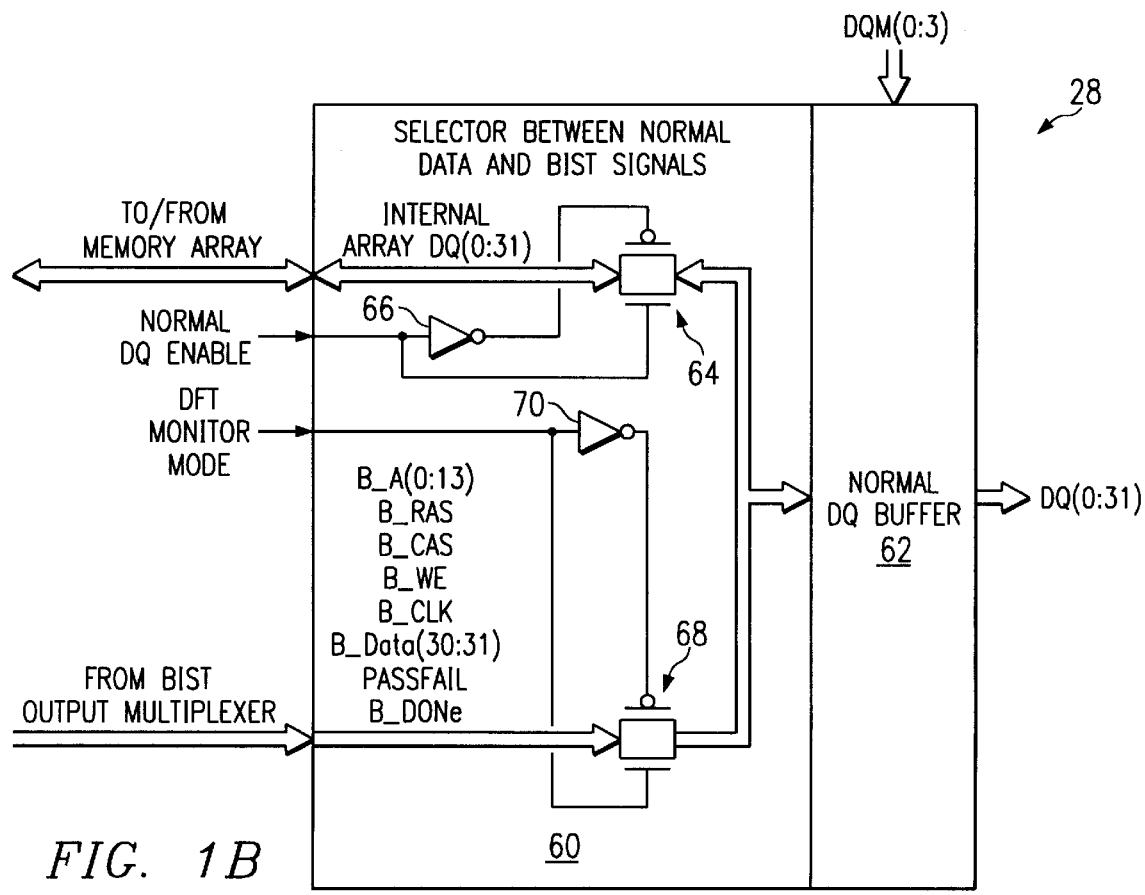

FIG. 1A is a block diagram of one embodiment of an integrated circuit memory device, indicated generally at 10, having a built-in self test circuit 12 with a monitor mode according to the teachings of the present invention. In a normal operation mode, memory device 10 receives external clocks and control signals, including address, RAS, CAS, and WE, to function as a conventional memory array. However, in a built-in self test monitor mode, BIST circuit 12 is operable to provide monitored test signals at the output terminals of memory device 10. During monitor mode, the test signals are output from the memory device 10 by multiplexing the signals with output terminals (DQ 0:31) and selecting them using a BIST monitor mode select signal. FIG. 1B shows one embodiment of the multiplex circuit in place prior to conventional DQ buffers that interface to external input/output (IO) terminals. When memory device 10 is in normal mode, the normal DQ enable signal is a logic high, and the DQ buffers are connected to the internal memory 10 array. When memory device 10 is in BIST monitor mode, the normal DQ enable signal is a logic low, and the DQ buffers are connected to signals from within BIST circuit 12.

As shown in the embodiment of FIG. 1, conventional memory array operation of memory device 10 can include a clock buffer 14, which receives a clock signal, CLK. An address buffer 18 receives address data, A (0:13), and a control buffer 20 receives control signals RAS, CAS and WE. A main control block 16 then receives a signal from clock buffer 14 as well as signals from control buffer 20. Address buffer 18 provides address data to a row decoder 22 and a column decoder 24 for selecting cells within memory array 26. In read mode, output data from memory array 26 is provided to DQ buffer 28, which in turn provides output data to output terminals DQ (0:31). DQ buffer 28 also receives multiplex signals DQM (0:3) and monitored signals from BIST circuitry 12. DQ buffer 28 further receives a monitor mode select signal, DFT MONITOR MODE, which determines whether output terminals DQ (0:31) provide data from memory array 26 or from monitored signals in BIST circuitry 12.

In the embodiment of FIG. 1A, BIST circuitry 12 includes a BIST detector 30 that receives the address data, A (0:13), and a control signal, CS. An oscillator 32 provides a clock signal to clock buffer 14 and to a program counter 34. BIST detector 30 checks whether memory device 10 is in BIST mode, and oscillator 32 generates the internal BIST clock for internal tests and for monitor and tester operation. Program counter 34 and a decoder 36 select which word from a ROM 38 is pointed to for running test algorithms stored within ROM 38. A timing generator 40 receives signal from ROM 38 and provides test signals to control buffer 28 for use during testing of the memory array. In one embodiment, timing generator 40 can choose one of three timing sets appropriate for testing operations. A data generator circuit 42 determines what data to write to memory array 26 for testing and also provides that data to a pass-fail compare circuit 44 for determining whether memory array 26 tests correctly. BIST circuitry 12 further includes address range registers 46 for allowing a subset of memory array 26 to be tested. Address counters 48 provide address signals to address buffer 18 and to output multiplexer 52 for use in testing. Enabled test unit 50 stores which tests are enabled during a particular test mode and supplies a signal to ROM 38 so that the appropriate test algorithms can be run.

BIST circuitry 12 further includes an output multiplexer 52 that provides multiplexed signals to DQ buffer 28. Output multiplexer 52 operates to supply the monitored signals from BIST circuitry 12 to DQ buffer 28 so that those signals can be monitored and used external to memory device 10. Output multiplexer 52 is used in the illustrated embodiment because the number of signals that can be monitored within BIST circuitry 12 exceeds the number of available output terminals from DQ buffer 28. It should be understood that if more output terminals were available, output multiplexer 52 would not be needed. In such a case, all key signals within BIST circuitry 12 could be monitored and supplied to separate terminals of memory device 10.

FIG. 1B shows one embodiment of DQ buffer 28 according to the teachings of the present invention. As shown, DQ buffer 28 includes a selector circuit 60 and a normal DQ buffer 62. Normal DQ buffer 62 receives multiplexing signals, DQM (0:3), and provides output signals on output terminals, DQ (0:31). Selector circuit 60 includes a pass gate 64, an inverter 66, a pass gate 68, and an inverter 70. Pass gate 64 communicates data between memory array 26 and normal DQ buffer 62. Pass gate 64 is turned on or off based upon the normal DQ enable signal, NORMAL DQ ENABLE, as shown. Similarly, pass gate 68 is turned on or off by monitor mode select signal, DFT MONITOR MODE, as shown. Pass gate 68 communicates information between BIST circuit 12 and normal DQ buffer 62. In the illustrated embodiment, the output from BIST circuit 12 is received from output multiplexer 52. The monitored signals can include address signals, RAS, CAS, WE, CLK, data, pass-fail and done signals, as shown. During operation of memory device 10, the normal mode or the monitor mode can be selected, but not both selected.

Figure 2:
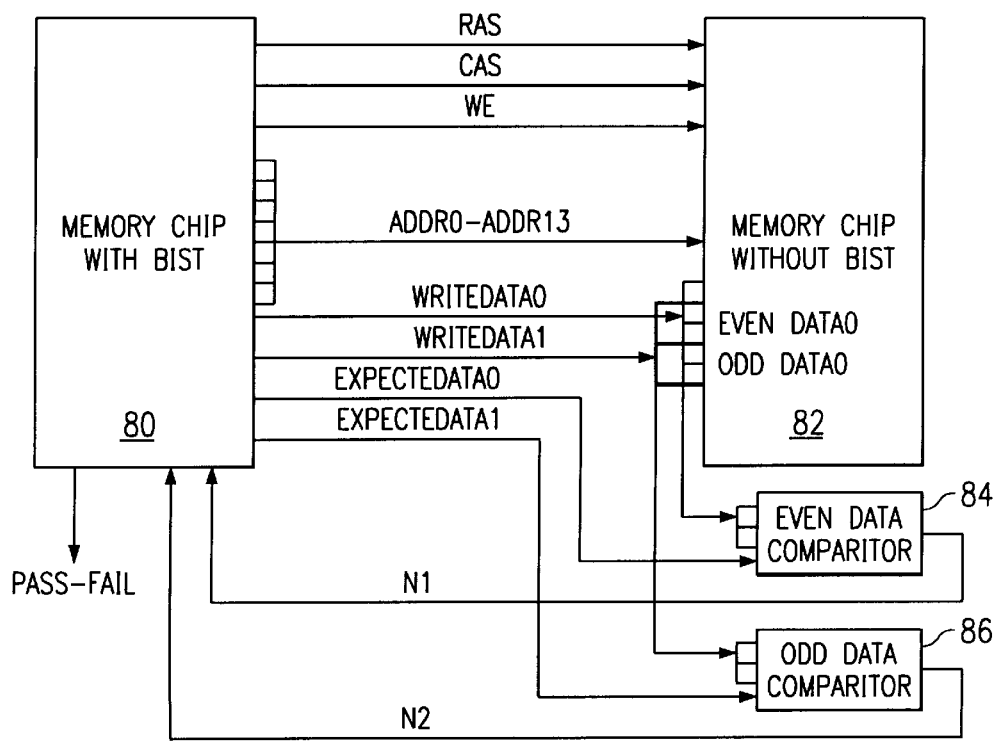
FIG. 2 is a block diagram of one embodiment of an integrated circuit memory chip having a built-in self test circuit with a tester mode according to the teachings of the present invention.

FIG. 2 is a block diagram of one embodiment of an integrated circuit memory device having a BIST circuit with a tester mode according to teachings of the present invention. As shown in FIG. 2, a first memory device 80 includes BIST circuitry. Memory device 80 provides test signals RAS, CAS, WE, address data, write data, and expected data, as shown, where these signals are monitored signals from within the BIST circuitry as described with respect to FIGS. 1A and 1B. A second memory device 82 is a memory device to be tested by memory device 80 and does not need BIST circuitry. Memory device 82 receives the test signals from memory device 80 and is tested based upon those signals.

Output data from memory device 82 is then provided to an even data comparator 84, and an odd data comparator 86 to compare the output data with expected data. Signals, N1 and N2, are then provided back to memory device 80, which then provides a pass-fail signal, PASS-FAIL, stating whether or not memory device 82 passed. According to the embodiment of FIG. 2, the RAS, CAS, WE and clock signals are the wave forms and control signals and the ADDR0–ADDR13 signals are the memory address signals from the BIST circuitry in memory device 80. The write data signals, WRITEDATA0 AND WRITEDATA1, are the data to be written into memory device 82 for testing. There are two data values so that an alternating pattern between odd and even memory cells can be used. Even data comparator 84 is a comparator between the data value from the memory device 82 and the expected value for the even output terminals. Odd data comparator 86 is a comparator between the data value from memory device 82 and the expected value for the odd output terminals. Signals N1 and N2 are respectively the even and odd result which are input to another terminal in memory device 80. Memory device 80 combines the result to output the pass-fail result for memory device 82. Alternatively, the results from combining N1 and N2 can be combined external to memory device 80.

Figure 3:
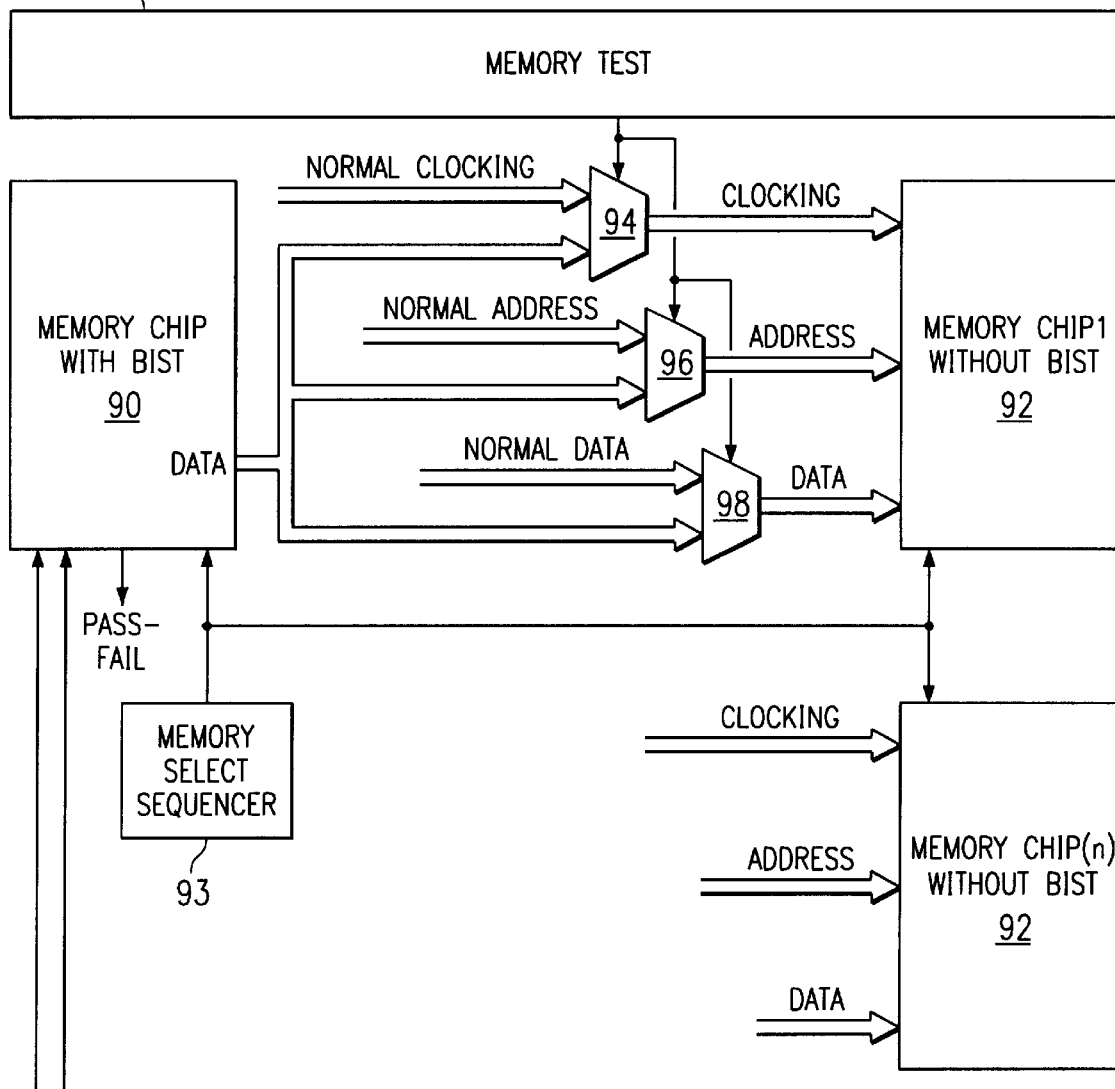
FIG. 3 is a block diagram of one embodiment of an integrated circuit memory device having a built-in self test circuit with a tester mode used to test a plurality of system memory chips according to the teachings of the present invention.

FIG. 3 is a block diagram of one embodiment of an integrated circuit memory device having a built-in self a test circuit with a tester mode used to test a plurality of system memory chips according to the teachings of the present invention. As shown, a memory device 90 has built-in self test circuitry as discussed above. When in tester mode, memory device 90 can be used to test a plurality of system memory devices 92, which do not need to have built-in self test circuitry. A memory select sequencer 93 can be used to provide memory device 90 and memory device 92 with select signals for whichever memory device 92 is currently being tested.

Multiplexers 94, 96 and 98 allow a memory test unit 100 to selectively connect monitored signals from memory device 90 to a memory device 92 being tested. Memory test block 100 selects between normal clocking, addressing and data, and these same signals arriving from memory device 90. An even data comparator 102 and an odd data comparator 104 then compare the data from the memory device 92 being tested with expected data, and provide a signal to memory device 90 with the results. Memory device 90 then provides a pass-fail signal with respect to the memory device being tested. The embodiment of FIG. 3 embeds a memory device 90 having built-in self test circuitry in a system and permits memory device 90 to test other memory devices 92 responsive to a self-test command. Memory select sequencer 93 selects which memory device 92 is to be tested and uses the select signal, CS, on each memory device 92 to select one device. The memory select sequencer 93 controls which memory device 92 is to use the tester signals from memory device 90 and output data to comparators 102 and 104.

Although the present invention has been described in detail, it should be understood that various changes, substitutions and alterations can be made thereto without departing from the spirit and scope of the invention as defined by the appended claims.

What is claimed is:

1. An integrated circuit memory device, comprising:
  a memory array having a plurality of memory cells, the memory array operable, responsive to array address signals and array control signals, to store data in the memory cells and to provide array output signals representing data stored in the memory cells;
  a built-in self test circuit connected to receive a self test select signal that indicates whether the memory device is in self test mode, the built-in self test circuit operable to generate internal self test signals for operating and testing the memory array when the memory device is in self test mode; and
  a data buffer connected to receive the internal self test signals and a monitor mode signal that indicates whether the memory device is in self test monitor mode, the data buffer operable to data connect the internal self test signals to terminals of the memory device to provide the internal self test signals externally from the memory device when the memory device is in self test monitor mode.

2. The integrated circuit memory device of claim 1, wherein the internal self test signals provided externally from the memory device are connected to a tester to verify operation of the built-in self test circuit.

3. The integrated circuit memory device of claim 1, wherein the internal self test signals provided externally from the memory device are connected to a second memory device to test operation of the second memory device.

4. The integrated circuit memory device of claim 1, wherein:
  the self test signals comprise internal memory address, control, and data signals and internal pass/fail signals;
  the internal memory address, control and data signals used to operate the memory array when the memory device is in self test mode; and
  the internal pass/fail signals indicating results of self test.

5. The integrated circuit memory device of claim 4, wherein:
  the built-in self test circuit comprises an output multiplexer connected to receive the internal memory address signals, the internal memory control signals, and the pass/fail signals; and
  the output multiplexer operable to select a portion of the internal memory address signals, the internal memory control signals, and the pass/fail signals to connect to the data buffer of the memory device.

6. A method of operation for an integrated circuit memory device to allow monitoring of a built-in self test circuit, comprising:
  receiving a monitor mode signal indicating that the memory device is in a self test monitor mode; and
  connecting internal self test signals generated by the built-in self test circuit to data terminals of the memory device responsive to the indication of self test monitor mode, the terminals available for external connection to monitor the internal self test signals.

7. The method of claim 6, further comprising connecting the terminals of the memory device to a tester for verifying operation of the built-in self test circuit based upon the monitored internal self test signals.

8. The method of claim 6, wherein:
  the internal self test signals comprise internal memory address, control, and data signals and internal pass/fail signals;
  the internal memory address, control and data signals used to operate a memory array when the memory device is in self test mode; and
  the internal pass/fail signals indicating results of self test.

9. A method of testing an integrated circuit memory device using another integrated circuit memory device having a built-in self test circuit, comprising:
  connecting internal self test signals generated by a built-in self test circuit in a first memory device to data terminals of the first memory device;
  connecting the terminals of the first memory device to terminals of a second memory device, the second memory devise thereby receiving the self test signals from the first memory device;
  running a self test process of the built-in self test circuit to test the second memory device using the self test signals; and
  providing pass/fail signals indicating results of testing the second memory device.

10. The method of claim 9, wherein running the self test process includes;
  writing data to the second memory device;
  reading data from the second memory device; and
  comparing the data read from the second memory device with expected data.

11. The method of claim 10, wherein comparing is accomplished externally from the first memory device.

12. The method of claim 10, wherein comparing is accomplished internal to the first memory device.

13. The method of claim 9, wherein connecting, connecting, running and providing are repeated to test a plurality of system memory devices.

14. The method of claims 13, where connecting, connecting, running and providing are accomplished under control of a system memory test process.

15. The method of claim wherein the second memory device has a built-in self test circuit.

* * * * *